(12) United States Patent
Rölle et al.

(10) Patent No.: US 8,877,408 B2
(45) Date of Patent: *Nov. 4, 2014

(54) URETHANES USED AS ADDITIVES IN A PHOTOPOLYMER FORMULATION

(75) Inventors: Thomas Rölle, Leverkusen (DE); Friedrich-Karl Bruder, Krefeld (DE); Thomas Fäcke, Leverkusen (DE); Marc-Stephan Weiser, Leverkusen (DE); Dennis Hönel, Zülpich (DE)

(73) Assignee: Bayer MaterialScience AG, Leverkusen (DE)

( * ) Notice: Subject to any disclaimer, the term of this patent is extended or adjusted under 35 U.S.C. 154(b) by 76 days.

This patent is subject to a terminal disclaimer.

(21) Appl. No.: 13/504,007

(22) PCT Filed: Nov. 2, 2010

(86) PCT No.: PCT/EP2010/066596
§ 371 (c)(1), (2), (4) Date: Apr. 25, 2012

(87) PCT Pub. No.: WO2011/054799
PCT Pub. Date: May 12, 2011

(65) Prior Publication Data
US 2012/0321997 A1 Dec. 20, 2012

(30) Foreign Application Priority Data
Nov. 3, 2009 (EP) .................................. 09013767

(51) Int. Cl.
*G03H 1/04* (2006.01)
*C08G 18/28* (2006.01)
(Continued)

(52) U.S. Cl.
CPC ............... *C08G 18/282* (2013.01); *G03H 1/04* (2013.01); *G03H 2260/12* (2013.01); *G03H*
(Continued)

(58) Field of Classification Search
CPC ............. C08G 18/282; C08G 18/4277; C08G 18/4887; C08G 18/672; C08G 18/71; C08G 18/776; C08G 18/7887; C08G 18/8175; C08F 283/006; C08F 290/00; C08F 290/06; C08F 290/067; C08F 290/14; C08F 290/147; C08F 299/06; C08L 75/16; G03F 7/001
See application file for complete search history.

(56) References Cited

U.S. PATENT DOCUMENTS 2,433,595 A * 12/1947 Campbell ...................... 524/113
2,937,966 A * 5/1960 Updegraff et al. ............ 428/530
(Continued)

FOREIGN PATENT DOCUMENTS

EP 1403709 A2 3/2004
WO WO-2008/125199 A1 10/2008
(Continued)

OTHER PUBLICATIONS

Wypych, Handbook of Plasticizers, Chapter 2, pp. 7-71 (2004).*
(Continued)

*Primary Examiner* — Martin Angebranndt
(74) *Attorney, Agent, or Firm* — Drinker Biddle & Reath LLP

(57) ABSTRACT

The invention relates to a photopolymer formulation comprising matrix polymers, writing monomers and photo initiators, to a method for producing said photopolymer formulation, a photopolymer formulation obtained according to said method, a sheeting, a film, a layer, a layer structure or a moulded body made from said photopolymer formulation and to the use of said photopolymer formulation for producing optical elements, in particular for producing holographic elements and images.

14 Claims, 3 Drawing Sheets

Measured Δn of the photopolymer formulations containing Examples (■) and Comparative Examples (♦) as a function of the refractive $n_D^{20}$ index

(51) Int. Cl.

| | | |
|---|---|---|
| *C08F 283/00* | (2006.01) | |
| *C08F 290/00* | (2006.01) | |
| *C08F 290/06* | (2006.01) | |
| *C08F 290/14* | (2006.01) | |
| *C08F 299/06* | (2006.01) | |
| *C08G 18/42* | (2006.01) | |
| *C08G 18/48* | (2006.01) | |
| *C08G 18/67* | (2006.01) | |
| *C08G 18/71* | (2006.01) | |
| *C08G 18/77* | (2006.01) | |
| *C08G 18/78* | (2006.01) | |
| *C08G 18/81* | (2006.01) | |
| *C08L 75/16* | (2006.01) | |
| *G02B 1/04* | (2006.01) | |
| *G03F 7/00* | (2006.01) | |
| *G03F 7/004* | (2006.01) | |
| *G03F 7/035* | (2006.01) | |
| *G03H 1/02* | (2006.01) | |
| *G03H 1/26* | (2006.01) | |
| *G11B 7/24044* | (2013.01) | |
| *G11B 7/245* | (2006.01) | |
| *G11B 7/26* | (2006.01) | |

(52) U.S. Cl.
CPC ............ 2260/30 (2013.01); *G03H 2001/0264* (2013.01); *G03H 2240/25* (2013.01); *G03H 1/2645* (2013.01); *C08F 283/006* (2013.01); *C08F 290/00* (2013.01); *C08F 290/06* (2013.01); *C08F 290/067* (2013.01); *C08F 290/14* (2013.01); *C08F 290/147* (2013.01); *C08F 299/06* (2013.01); *C08G 18/4277* (2013.01); *C08G 18/4887* (2013.01); *C08G 18/672* (2013.01); *C08G 18/71* (2013.01); *C08G 18/776* (2013.01); *C08G 18/7887* (2013.01); *C08G 18/8175* (2013.01); *C08L 75/16* (2013.01); *G02B 1/04* (2013.01); *G03F 7/001* (2013.01); *G03F 7/0046* (2013.01); *G03F 7/035* (2013.01); *G11B 7/24044* (2013.01); *G11B 7/245* (2013.01); *G11B 7/26* (2013.01)

USPC ............ 430/1; 430/2; 430/280.1; 430/281.1; 359/3

(56) References Cited

U.S. PATENT DOCUMENTS

| | | | |
|---|---|---|---|
| 4,210,568 A * | 7/1980 | Makowski et al. | 524/238 |
| 4,242,488 A * | 12/1980 | Stanley et al. | 428/423.1 |
| 4,247,624 A * | 1/1981 | Foss | 430/281.1 |
| 5,415,972 A | 5/1995 | Mayes | |
| 5,858,614 A * | 1/1999 | Sato et al. | 430/280.1 |
| 6,403,702 B1 * | 6/2002 | Markusch et al. | 524/590 |
| 6,780,546 B2 | 8/2004 | Trentler et al. | |
| 2003/0087104 A1 * | 5/2003 | Dhar et al. | 428/422.8 |
| 2004/0063027 A1 * | 4/2004 | Barr et al. | 430/270.1 |
| 2008/0311482 A1 * | 12/2008 | Stockel et al. | 430/2 |
| 2008/0312403 A1 * | 12/2008 | Stockel et al. | 528/59 |
| 2009/0185470 A1 * | 7/2009 | Stoeckel et al. | 369/103 |
| 2011/0236803 A1 * | 9/2011 | Weiser et al. | 430/2 |
| 2012/0214089 A1 * | 8/2012 | Honel et al. | 430/2 |
| 2012/0214090 A1 * | 8/2012 | Weiser et al. | 430/2 |
| 2012/0214895 A1 * | 8/2012 | Rolle et al. | 522/78 |
| 2012/0219883 A1 * | 8/2012 | Bruder et al. | 430/2 |
| 2012/0219884 A1 * | 8/2012 | Weiser et al. | 430/2 |
| 2012/0219885 A1 * | 8/2012 | Facke et al. | 430/2 |
| 2012/0231376 A1 * | 9/2012 | Rolle et al. | 430/2 |
| 2012/0231377 A1 * | 9/2012 | Weiser et al. | 430/2 |
| 2012/0237856 A1 * | 9/2012 | Rolle et al. | 430/2 |
| 2012/0302659 A1 * | 11/2012 | Rolle et al. | 522/173 |
| 2012/0321998 A1 * | 12/2012 | Rolle et al. | 430/2 |
| 2013/0224634 A1 * | 8/2013 | Berneth et al. | 430/2 |

FOREIGN PATENT DOCUMENTS

| | | |
|---|---|---|
| WO | WO-2008/125229 A1 | 10/2008 |
| WO | WO-2008125202 A1 | 10/2008 |
| WO | 2009/014112 * | 1/2009 |

OTHER PUBLICATIONS

International Search Report for PCT/EP2010/066596 mailed Sep. 5, 2011.

* cited by examiner

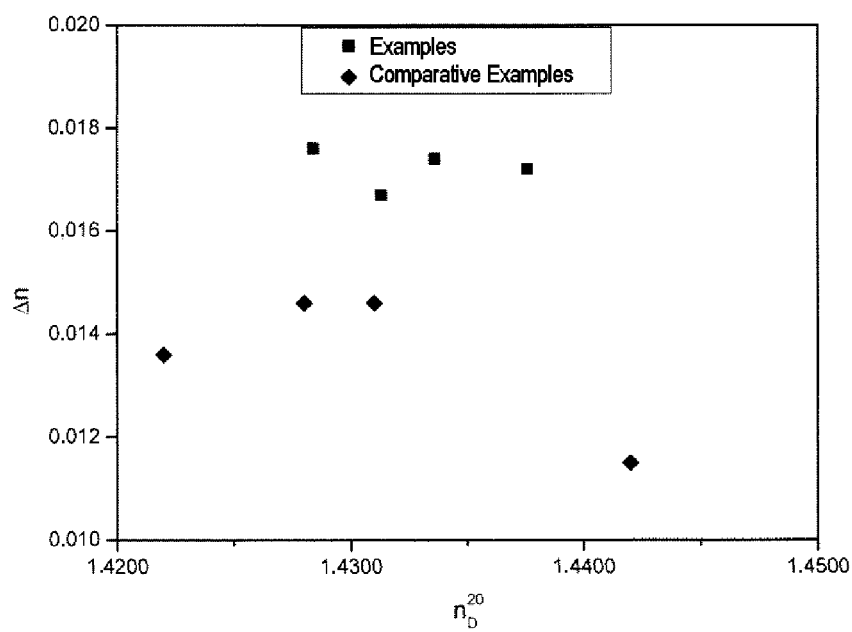
Figure 3: Measured Δn of the photopolymer formulations containing Examples ( ■ ) and Comparative Examples ( ♦ ) as a function of the refractive $n_D^{20}$ index

URETHANES USED AS ADDITIVES IN A PHOTOPOLYMER FORMULATION

CROSS-REFERENCE TO RELATED APPLICATIONS

This application is a national stage application (under 35 U.S.C. §371) of PCT/EP2010/066596, filed Nov. 2, 2010, which claims benefit of European application 09013767.0, filed Nov. 3, 2009, both of which are incorporated herein by reference in their entirety for all their useful purposes.

BACKGROUND

The invention relates to a photopolymer formulation comprising matrix polymers, writing monomers and photoinitiators, a process for the preparation of the photopolymer formulation, a photopolymer formulation obtainable by the process, a sheet, a film, a layer, a layer structure or a moulding comprising the photopolymer formulation and the use of the photopolymer formulation for the production of optical elements, in particular for the production of holographic elements and images.

WO 2008/125229 A1 describes photopolymer formulations of the type mentioned at the outset. These comprise polyurethane-based matrix polymers, acrylate-based writing monomers and photoinitiators. In the cured state, the writing monomers and the photoinitiators are embedded with spatial distribution in the polyurethane matrix. The WO document likewise discloses the addition of dibutyl phthalate, a classic plasticizer for industrial plastics, to the photopolymer formulation.

For the uses of photopolymer formulations in the fields of use described below, the refractive index modulation $\Delta n$ produced by the holographic exposure in the photopolymer plays a decisive role. In the holographic exposure, the interference field comprising signal and reference light beam (in the simplest case, the two plane waves) is formed by the local photopolymerization of, for example, highly refracting acrylates at sites of high intensity in the interference field in a refractive index grating. The refractive index grating in the photopolymer (the hologram) contains all information of the signal light beam. By illuminating the hologram only with the reference light beam, the signal can then be reconstructed again. The strength of the signal thus reconstructed in relation to the strength of the incident reference light is referred to as Diffraction Efficiency, or DE below. In the simplest case of a hologram which forms from the superposition of two plane waves, the DE is obtained from the quotient of the intensity of the light diffracted in the reconstruction and the sum of the intensities of incident reference light and diffracted light. The higher the DE, the more efficient is a hologram with respect to the necessary quantity of reference light, which is necessary for making the signal visible with a fixed brightness. Highly refracting acrylates are capable of producing refractive index gratings with high amplitude between regions with lowest refractive index and regions with highest refractive index and hence permitting holograms having high DE and high $\Delta n$ in photopolymer formulations. It should be noted that the DE depends on the product of $\Delta n$ and the photopolymer layer thickness d. The greater the product, the greater is the possible DE (for reflection holograms). The width of the angular range in which the hologram is visible (reconstructed), for example in the case of monochromatic illumination, depends only on the layer thickness d. On illumination of the hologram with, for example, white light, the width of the spectral range which can contribute to the reconstruction of the hologram likewise depends only on the layer thickness d. It is true that the smaller d, the greater the respective acceptance widths. If it is hence intended to produce light and easily visible holograms, a high n·d and a low thickness d are desirable, in particular so that DE is as large as possible. This means that the higher n, the more latitude there is for producing light holograms by adaptation of d and without loss of DE. The optimization of n in the optimization of photopolymer formulations is therefore of outstanding importance (Ref. Hariharan Optical Holography).

BRIEF DESCRIPTION OF EMBODIMENTS

It was an object of the present invention to provide a photopolymer formulation which permits the production of holograms having higher brightness in comparison with the known formulations.

This object is achieved, in the case of the photopolymer formulation according to the invention, if it contains urethanes as plasticizers. Thus, it was found that the addition of urethanes to the known photopolymer formulations leads to high $\Delta n$ values in the case of the holograms produced therefrom. In the end, this means that the holograms produced from the formulation according to the invention have a higher brightness in comparison with the known holograms.

According to a first embodiment, the matrix polymers are polyurethanes. Preferably, the polyurethanes are obtainable by reacting an isocyanate component a) with an isocyanate-reactive component b).

BRIEF DESCRIPTION OF THE DRAWINGS

The foregoing brief description, as well as the following detailed description, may be better understood when read in conjunction with the appended drawings. For the purpose of assisting in the explanation of the invention, there are shown in the drawings representative embodiments which are considered illustrative. It should be understood, however, that the invention is not limited in any manner to the precise arrangements and instrumentalities shown.

In the drawings:

FIG. 3 illustrates a graph showing the measured $\Delta n$ of photopolymer formulations.

DETAILED DESCRIPTION OF EMBODIMENTS

Figure 1:
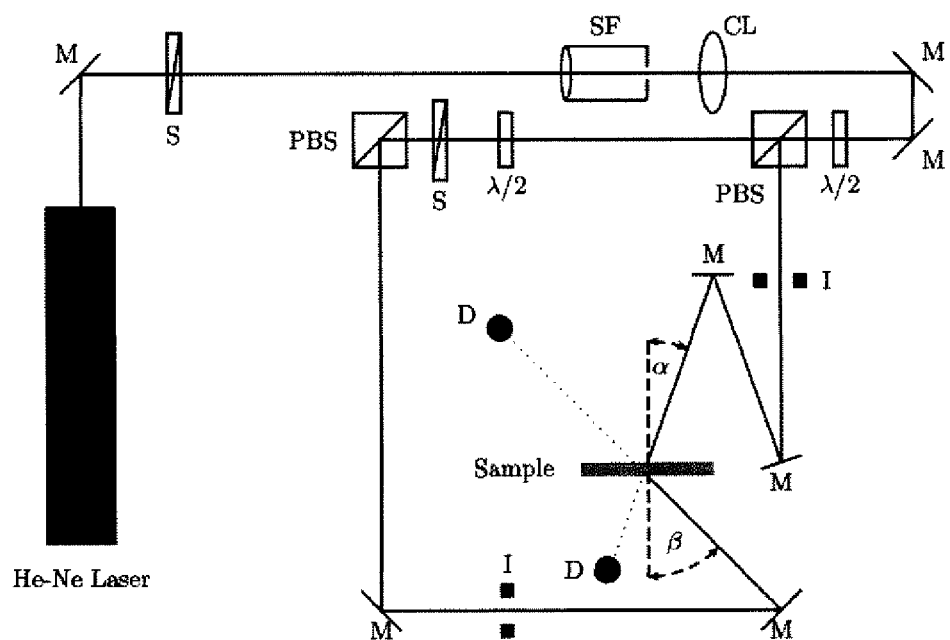
FIG. 1 illustrates a measuring arrangement.

The isocyanate component a) preferably comprises polyisocyanates. Polyisocyanates which may be used are all compounds well known per se to the person skilled in the art or mixtures thereof, which have on average two or more NCO functions per molecule. These may have an aromatic, araliphatic, aliphatic or cycloaliphatic basis. In minor amounts, monoisocyanates and/or polyisocyanates containing unsaturated groups may also be concomitantly used.

For example, butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluoylene diisocyanate, 1,5-naphthylene diisocyanate, 2,4'- or 4,4'-diphenylmethane diisocyanate and/or triphenylmethane 4,4',4"-triisocyanate are suitable.

The use of derivatives of monomeric di- or triisocyanates having urethane, urea, carbodiimide, acylurea, isocyanurate, allophanate, biuret, oxadiazinetrione, uretdione and/or iminooxadiazinedione structures is also possible.

The use of polyisocyanates based on aliphatic and/or cycloaliphatic di- or triisocyanates is preferred.

Particularly preferably, the polyisocyanates of component a) are dimerized or oligomerized aliphatic and/or cycloaliphatic di- or triisocyanates.

Isocyanurates, uretdiones and/or iminooxadiazinediones based on HDI, 1,8-diisocyanato-4-(isocyanatomethyl)octane or mixtures thereof are very particularly preferred.

NCO-functional prepolymers having urethane, allophanate, biuret and/or amide groups can likewise be used as component a). Prepolymers of component a) are obtained in a manner well known per se to the person skilled in the art by reacting monomeric, oligomeric or polyisocyanates a1) with isocyanate-reactive compounds a2) in suitable stoichiometry with optional use of catalysts and solvents.

Suitable polyisocyanates a1) are all aliphatic, cycloaliphatic, aromatic or araliphatic di- and triisocyanates known per se to the person skilled in the art, it being unimportant whether these were obtained by means of phosgenation or by phosgene-free processes. In addition, the higher molecular weight secondary products of monomeric di- and/or triisocyanates having a urethane, urea, carbodiimide, acylurea, isocyanurate, allophanate, biuret, oxadiazinetrione, uretdione or iminooxadiazinedione structure, which are well known per se to the person skilled in the art, can also be used in each case individually or in any desired mixtures with one another.

Examples of suitable monomeric di- or triisocyanates which can be used as component a1) are butylene diisocyanate, hexamethylene diisocyanate (HDI), isophorone diisocyanate (IPDI), trimethylhexamethylene diisocyanate (TMDI), 1,8-diisocyanato-4-(isocyanatomethyl)octane, isocyanatomethyl-1,8-octane diisocyanate (TIN), 2,4- and/or 2,6-toluene diisocyanate.

OH-functional compounds are preferably used as isocyanate-reactive compounds a2) for the synthesis of the prepolymers. These are analogous to the OH-functional compounds as described below for the component b).

The use of amines for the prepolymer preparation is also possible. For example, ethylenediamine, diethylenetriamine, triethylenetetramine, propylenediamine, diaminocyclohexane, diaminobenzene, diaminobisphenyl, difunctional polyamines, such as, for example, the Jeffamines®, amine-terminated polymers having number average molar masses of up to 10 000 g/mol, or any desired mixtures thereof with one another are suitable.

For the preparation of prepolymers containing biuret groups, isocyanate is reacted in excess with amine, a biuret group forming In this case, suitable amines for the reaction with the di-, tri- and polyisocyanates mentioned are all oligomeric or polymeric, primary or secondary, difunctional amines of the abovementioned type.

Preferred prepolymers are urethanes, allophanates or biurets obtained from aliphatic isocyanate-functional compounds and oligomeric or polymeric isocyanate-reactive compounds having number average molar masses of 200 to 10 000 g/mol; urethanes, allophanates or biurets obtained from aliphatic isocyanate-functional compounds and oligomeric or polymeric polyols or polyamines having number average molar masses of 500 to 8500 g/mol are particularly preferred and allophanates obtained from HDI or TMDI and difunctional polyetherpolyols having number average molar masses of 1000 to 8200 g/mol are very particularly preferred.

The prepolymers described above preferably have residual contents of free monomeric isocyanates of less than 1% by weight, particularly preferably less than 0.5% by weight, very particularly preferably less than 0.2% by weight.

Of course, the isocyanate component may contain proportionately further isocyanate components in addition to the prepolymers described. Aromatic, araliphatic, aliphatic and cycloaliphatic di-, tri- or polyisocyanates are suitable for this purpose used. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate (TMDI), the isomeric bis(4,4'-isocyanatocyclohexyl)methanes and mixtures thereof having any desired isomer content, is ocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluoylene diisocyanate, 1,5-naphthylene diisocyanate, 2,4'- or 4,4'-diphenylmethane diisocyanate, triphenylmethane 4,4',4"-triisocyanate or derivatives thereof having a urethane, urea, carbodiimide, acylurea, isocyanurate, allophanate, biuret, oxadiazinetrione, uretdione or iminooxadiazinedione structure and mixtures thereof. Polyisocyanates based on oligomerized and/or derivatized diisocyanates which were freed from excess diisocyanate by suitable processes are preferred, in particular those of hexamethylene diisocyanate. The oligomeric isocyanurates, uretdiones and iminooxadiazinediones of HDI and mixtures thereof are particularly preferred.

It is optionally also possible for the isocyanate component a) proportionately to contain isocyanates which are partly reacted with isocyanate-reactive ethylenically unsaturated compounds. $\alpha,\beta$-unsaturated carboxylic acid derivatives, such as acrylates, methacrylates, maleates, fumarates, maleimides, acrylamides, and vinyl ethers, propenyl ethers, allyl ethers and compounds which contain dicyclopentadienyl units and have at least one group reactive towards isocyanates are preferably used here as isocyanate-reactive ethylenically unsaturated compounds; these are particularly preferably acrylates and methacrylates having at least one isocyanate-reactive group. Suitable hydroxy-functional acrylates or methacrylates are, for example, compounds such as 2-hydroxyethyl(meth)acrylate, polyethylene oxide mono(meth)acrylates, polypropylene oxide mono(meth)acrylates, polyalkylene oxide mono(meth)acrylates, poly($\epsilon$-caprolactone) mono(meth)acrylates, such as, for example, Tone® M100 (Dow, USA), 2-hydroxypropyl(meth)acrylate, 4-hydroxybutyl(meth)acrylate, 3-hydroxy-2,2-dimethylpropyl(meth)acrylate, the hydroxyfunctional mono-, di- or tetra(meth)acrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or the industrial mixtures thereof. In addition, isocyanate-reactive oligomeric or polymeric unsaturated compounds containing acrylate and/or methacrylate groups, alone or in combination with the abovementioned monomeric compounds, are suitable. The proportion of isocyanates which are partly reacted with isocyanate-reactive ethylenically unsaturated compounds, based on the isocyanate component a), is 0 to 99%, preferably 0 to 50%, particularly preferably 0 to 25% and very particularly preferable 0 to 15%.

It is optionally also possible for the abovementioned isocyanate component a) completely or proportionately to contain isocyanates which are reacted completely or partly with blocking agents known to the person skilled in the art from coating technology. The following may be mentioned as an example of blocking agents: alcohols, lactams, oximes, malonic esters, alkyl acetoacetates, triazoles, phenols, imidazoles, pyrazoles and amines, such as, for example, butanone oxime, diisopropylamine, 1,2,4-triazole, dimethyl-1,2,4-triazole, imidazole, diethyl malonate, ethyl acetoacetate, acetone oxime, 3,5-dimethylpyrazole, ε-caprolactam, N-tert-butylbenzylamine, cyclopentanone carboxyethyl ester or any desired mixtures of these blocking agents.

In principle, all polyfunctional, isocyanate-reactive compounds which have on average at least 1.5 isocyanate-reactive groups per molecule can be used as component b).

Isocyanate-reactive groups in the context of the present invention are preferably hydroxyl, amino or thio groups, and hydroxy compounds are particularly preferred.

Suitable polyfunctional, isocyanate-reactive compounds are, for example, polyesterpolyols, polyetherpolyols, polycarbonatepolyols, poly(meth)acrylatepolyols and/or polyurethanepolyols.

Suitable polyesterpolyols are, for example, linear polyesterdiols or branched polyesterpolyols as obtained in a known manner from aliphatic, cycloaliphatic or aromatic di- or polycarboxylic acids or their anhydrides with polyhydric alcohols having an OH functionality of ≥2.

Examples of such di- or polycarboxylic acids or anhydrides are succinic, glutaric, adipic, pimelic, suberic, azelaic, sebacic, nonanedicarboxylic, decanedicarboxylic, terephthalic, isophthalic, o-phthalic, tetrahydrophthalic, hexahydrophthalic or trimellitic acid and acid anhydrides, such as o-phthalic, trimellitic or succinic anhydride, or any desired mixtures thereof with one another.

Examples of such suitable alcohols are ethanediol, di-, tri- and tetraethylene glycol, 1,2-propanediol, di-, tri- and tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures thereof with one another.

The polyesterpolyols may also be based on natural raw materials, such as castor oil. It is also possible for the polyesterpolyols to be based on homo- or copolymers of lactones, as can preferably be obtained by addition reaction of lactones or lactone mixtures, such as butyrolactone, ε-caprolactone and/or methyl-ε-caprolactone, with hydroxy-functional compounds, such as polyhydric alcohols having an OH functionality of ≥2, for example of the abovementioned type.

Such polyesterpolyols preferably have number average molar masses of 400 to 4000 g/mol, particularly preferably of 500 to 2000 g/mol. Their OH functionality is preferably 1.5 to 3.5, particularly preferably 1.8 to 3.0.

Suitable polycarbonatepolyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols mentioned in relation to the polyester segments and having an OH functionality of ≥2, preferably 1,4-butanediol, 1,6-hexanediol and/or 3-methylpentanediol, or polyesterpolyols can be converted into polycarbonatepolyols.

Such polycarbonatepolyols preferably have number average molar masses of 400 to 4000 g/mol, particularly preferably of 500 to 2000 g/mol. The OH functionality of these polyols is preferably 1.8 to 3.2, particularly preferably 1.9 to 3.0.

Suitable polyetherpolyols are optionally polyadducts of cyclic ethers with OH— or NH— functional starter molecules, which polyadducts have a block structure.

Suitable cyclic ethers are, for example, styrene oxides, ethylene oxide, propylene oxide, tetrahydrofuran, butylene oxide, epichlorohydrin and any desired mixtures thereof.

The polyhydric alcohols mentioned per se in the context of the polyesterpolyols and having an OH functionality of ≥2 and primary or secondary amines and aminoalcohols can be used as starters.

Preferred polyetherpolyols are those of the abovementioned type, exclusively based on propylene oxide or random or block copolymers based on propylene oxide with further 1-alkylene oxides, the proportion of 1-alkylene oxides not being higher than 80% by weight. In addition, poly(trimethylene oxides) and mixtures of the polyols mentioned as being preferred are preferred. Propylene oxide homopolymers and random or block copolymers which have oxyethylene, oxypropylene and/or oxybutylene units are particularly preferred, the proportion of the oxypropylene units, based on the total amount of all oxyethylene, oxypropylene and oxybutylene units, accounting for at least 20% by weight, preferably at least 45% by weight. Here, oxypropylene- and oxybutylene-comprise all respective linear and branched C3- and C4-isomers.

Such polyetherpolyols preferably have number average molar masses of 250 to 10 000 g/mol, particularly preferably of 500 to 8500 g/mol and very particularly preferably of 600 to 4500 g/mol. The OH functionality is preferably 1.5 to 4.0, particularly preferably 1.8 to 3.1.

In addition, short-chain, aliphatic, araliphatic or cycloaliphatic di-, tri- or polyfunctional alcohols which have a low molecular weight, i.e. having molecular weights of less than 500 g/mol, i.e. contain 2 to 20 carbon atoms, are also suitable as constituents of component b) as polyfunctional, isocyanate-reactive compounds.

These may be, for example, ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positional isomers of diethyloctanediol, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), 2,2-dimethyl-3-hydroxypropyl 2,2-dimethyl-3-hydroxypropionate. Examples of suitable triols are trimethylolethane, trimethylolpropane or glycerol. Suitable higher-functional alcohols are ditrimethylolpropane, pentaerythritol, dipentaerythritol or sorbitol.

One or more photoinitiators are used as component c). These are usually initiators which can be activated by actinic radiation and which initiate polymerization of the corresponding polymerizable groups. Photoinitiators are commercially distributed compounds known per se, a distinction being made between monomolecular (type I) and bimolecular (type II) initiators. Furthermore, depending on their chemical nature, these initiators are used for free radical, anionic (or) cationic (or mixed) forms of the abovementioned polymerizations.

(Type I) systems for free radical photopolymerization are, for example, aromatic ketone compounds, e.g. benzophenones in combination with tertiary amines, alkylbenzophenones, 4,4'-bis(dimethylamino)benzophenone (Michlers ketone), anthrone and halogenated benzophenones or mixtures of said types. Also suitable are (type II) initiators, such as benzoin and its derivatives, benzil ketals, acylphosphine oxides, e.g. 2,4,6-trimethylbenzoyldiphenylphosphine oxide, bisacylophosphine oxides, phenylglyoxylic acid esters, camphorquinone, alpha-aminoalkylphenones, alpha-,alpha-dialkoxyacetophenones, 1-[4-(phenylthio)phenyl]octane-1,2-dione 2-(O-benzoyloxime) and alpha-hydroxyalkylphenones. The photoinitiator systems described in EP-A 0223587 and consisting of a mixture of one ammonium arylalkylborate and one or more dyes can also be used as a photoinitiator. For example, tetrabutylammonium triphenylhexylborate, tetrabutylammonium triphenylbutylborate, tetrabutylammonium trinapthylhexylborate, tetrabutylammonium tris(4-tert-butyl)phenylbutylborate, tetrabutylammonium tris(3-fluorophenyl)hexylborate, tetramethylammonium triphenylbenzylborate, tetra(n-hexyl)ammonium (sec-butyl)triphenylborate, 1-methyl-3-octylimidazolium dipentyldiphenylborate and tetrabutylammonium tris(3-chloro-4-methylphenyl)hexylborate are suitable as the ammonium arylborate. Suitable dyes are, for example, new methylene blue, thionine, Basic Yellow, pinacynol chloride, rhodamine 6G, gallocyanine, ethyl violet, Victoria Blue R, Celestine Blue, quinaldine red, crystal violet, brilliant green, astrazone orange G, Darrow Red, pyronine Y, Basic Red 29, pyrillium I, cyanine and methylene blue, azure A (Cunningham et al., RadTech'98 North America UV/EB Conference Proceedings, Chicago, Apr. 19-22, 1998).

The photoinitiators used for the anionic polymerization are as a rule (type I) systems and are derived from transition metal complexes of the first series. Here are chromium salts, such as, for example, trans-$Cr(NH_3)_2(NCS)_4$— (Kutal et al., Macromolecules 1991, 24, 6872) or ferrocenyl compounds (Yamaguchi et al., Macromolecules 2000, 33, 1152). Another possibility of anionic polymerization consists in the use of dyes, such as crystal violet leuconitrile or malchite green leuconitrile, which can polymerize cyanoacrylates by photolytic decomposition (Neckers et al., Macromolecules 2000, 33, 7761). However, the chromophore is incorporated into the polymer here, such that the resulting polymers are coloured throughout.

The photoinitiators used for the cationic polymerization substantially consist of three classes: aryldiazonium salts, onium salts (here especially: iodonium, sulfonium and selenonium salts) and organometallic compounds. On irradiation, both in the presence and in the absence of a hydrogen donor, phenyldiazonium salts can produced a cation that initiates the polymerization. The efficiency of the total system is determined by the nature of the counterion used for the diazonium compound. The not very reactive but very expensive $SbF_6^-$, $AsF_6^-$ or $PF_6^-$ is preferred here. These compounds as a rule are not very suitable for use in the coating of thin films, since the nitrogen released after the exposure the surface quality is reduced (pinholes) (Li et al., Polymeric Materials Science and Engineering, 2001, 84, 139). Onium salts, especially sulfonium and iodonium salts, are very widely used and also commercially available in many forms. The photochemistry of these compounds has been investigated for a long time. After excitation, the iodonium salts initially decompose homolytically and thus produce a free radical and a radical anion which is stabilized by H abstraction and liberates a proton and then initiates the cationic polymerization (Dektar et al., J. Org. Chem. 1990, 55, 639; J. Org. Chem., 1991, 56, 1838). This mechanism permits the use of iodonium salts also for free radical polymerization. Once again, the choice of the counterion is of considerable importance here, very expensive $SbF_6^-$, $AsF_6^-$ or $PF_6^-$ is likewise preferred. Otherwise, the choice of substitution of the aromatic is entirely free in this structure class and is substantially determined by the availability of suitable starting building blocks for the synthesis. The sulfonium salts are compounds which decompose in according to Norrish(II) (Crivello et al., Macromolecules 2000, 33, 825). In the case of the sulfonium salts, too, the choice of the counterion is of critical importance, which manifests itself substantially in the curing rate of the polymers. The best results are obtained as a rule with $SbF_6^-$ salts. Since the self-absorption of iodonium and sulfonium salts occurs at <300 nm, these compounds must be appropriately sensitized for the photopolymerization with near UV or shortwave visible light. This is effected by the use of relatively highly absorbing aromatics, such as, for example, anthracene and derivatives (Gu et al., Am. Chem. Soc. Polymer Preprints, 2000, 41 (2), 1266) or phenothiazine or derivatives thereof (Hua et al, Macromolecules 2001, 34, 2488-2494).

It may also be advantageous to use mixtures of these compounds. Depending on the radiation source used for the curing, type and concentration of photoinitiator must be adapted in a manner known to the person skilled in the art. Further details are described, for example, in P. K. T. Oldring (ed.), Chemistry & Technology of UV & EB Formulations For Coatings, Inks & Paints, Vol. 3, 1991, SITA Technology, London, pages 61-328.

Preferred photoinitiators c) are mixtures of tetrabutylammonium tetrahexylborate, tetrabutylammonium triphenylhexylborate, tetrabutylammonium tris(3-fluorophenyl)hexylborate and tetrabutylammonium tris(3-chloro-4-methylphenyl)hexylborate with dyes, such as, for example, astrazone orange G, methylene blue, new methylene blue, azure A, pyrillium I, safranine O, cyanine, gallocyanine, brilliant green, crystal violet, ethyl violet and thionine.

In photopolymer formulations, very good results are achievable with highly refractive acrylates as contrast-imparting components, as described, for example, in U.S. Pat. No. 6,780,546. It is therefore preferable according to the invention if, in the photopolymer formulation, the writing monomers are acrylates, in particular urethane acrylates. Aromatic urethane acrylates having a refractive index of $n_D^{20} > 1.5000$ at 589 nm, as described, for example, in WO2008125199A1, are particularly preferred.

In a more preferred embodiment of the invention, the urethanes have a number average molecular weight of ≤250 g/mol, preferably of ≤200 g/mol and particularly preferably of ≤190 g/mol. Thus, it has been found that the effect described here no longer occurs if the molecular weight is >250 g/mol.

Advantageously, the photopolymer formulation contains only aliphatic urethanes. In this case, the aliphatic urethanes may have in particular the general formula (I)

(I)

in which $R^1$, $R^2$, $R^3$, independently of one another, are linear or branched (C1-C20)-alkyl radicals optionally substituted by heteroatoms. It is particularly preferable if $R^1$ are linear or branched (C1-C8)-alkyl radicals, $R^2$ are linear or branched (C1-C8)-alkyl radicals and/or $R^3$ are linear or branched (C1-C8)-alkyl radicals, it being particularly preferable if $R^1$ are linear or branched (C1-C4)-alkyl radicals, $R^2$ are linear or branched (C1-C6)-alkyl radicals and $R^3$ is hydrogen. In this case, it was in fact found that the urethanes thus obtained are very compatible with the polyurethane matrix and show the effect described here.

According to a further preferred embodiment, it is intended that the urethanes have substantially no free NCO groups.

The urethanes essential to the invention are obtainable by reacting isocyanates of the formula (II)

(II)

with isocyanate-reactive compounds of the formula (III)

the radicals having the abovementioned meaning.

Examples of compounds of the formula (II) are methyl isocyanate, ethyl isocyanate, the isomeric propyl isocyanates, the isomeric butyl isocyanates, the isomeric pentyl isocyanate, the isomeric hexyl isocyanates, the isomeric heptyl isocyanates, the isomeric octyl isocyanates, the isomeric nonyl isocyanates, the isomeric decyl isocyanates, stearyl isocyanate, cyclopropyl isocyanate, cyclobutyl isocyanate, cyclopentyl isocyanate, cyclohexyl isocyanate, cycloheptyl isocyanate or mixtures thereof.

Methyl isocyanate, ethyl isocyanate, the isomeric propyl isocyanates, the isomeric butyl isocyanates, the isomeric pentyl isocyanate, the isomeric hexyl isocyanates, the isomeric heptyl isocyanates, the isomeric octyl isocyanates or mixtures thereof are preferred.

n-Butyl isocyanate, n-hexyl isocyanate or mixtures thereof are particularly preferred.

For example, methanol, ethanol, the isomeric propanols, the isomeric butanols, the isomeric pentanols, the isomeric hexanols, the isomeric heptanols, the isomeric octanols, the isomeric decanols, the isomeric undecanols, the isomeric dodecanols, the isomeric tridecanols or mixtures thereof can be used as compounds of the formula (III).

Methanol, ethanol, the isomeric propanols, the isomeric butanols, the isomeric pentanols, the isomeric hexanols, the isomeric heptanols, the isomeric octanols or mixtures thereof are preferred.

Ethanol, isopropanol or mixtures thereof are particularly preferred.

The reaction of compounds of the formula (II) with compounds of the formula (III) is a urethanization. The reaction of compounds of the formula (II) with compounds of the formula (III) can be effected with the aid of the catalysts known for accelerating isocyanate addition reactions, such as, for example, tertiary amines, tin, zinc, iron or bismuth compounds, in particular triethylamine, 1,4-diazabicycl[2,2,2]octane, bismuth octoate and dibutyltin dilaurate, which can be initially introduced or metered in later. The urethanes according to the invention have a content of isocyanate groups (M=42) or free residual monomers of less 0.5% by weight, preferably less than 0.2% by weight, particularly preferably less than 0.1% by weight, based on the urethane. Furthermore, the urethanes contain contents of unconverted component, compounds of the formula (III), of less than 1% by weight, preferably less than 0.5% by weight and particularly preferably less than 0.2% by weight, based on the urethane. In the preparation of the urethanes, the compounds of the formula (II) and the compounds of the formula (III) can be dissolved in an unreactive solvent, for example an aromatic or aliphatic hydrocarbon or an aromatic or aliphatic halogenated hydrocarbon or a coating solvent, such as, for example, ethyl acetate or butyl acetate or acetone or butanone or an ether, such as tetrahydrofuran or tert-butyl methyl ether or a dipolar aprotic solvent, such as dimethyl sulphoxide or N-methylpyrrolidone or N-ethylpyrrolidone, and are initially introduced or metered in a manner familiar to the person skilled in the art. After the end of the reaction, the unreactive solvents are removed from the mixture under atmospheric pressure or under reduced pressure in the end point determined by determining the solids content. The solids contents are typically in a range from 99.999 to 95.0% by weight, preferably from 99.998 to 98.0% by weight, based on the urethane.

The photopolymer formulation according to the invention may contain in particular 15 to 79, preferably 30 to 60, % by weight of matrix polymer, 5 to 50, preferably 10 to 40, % by weight of writing monomer, 1 to 10, preferably 1 to 3, % by weight of photoinitiator and 5 to 50, preferably 10 to 40, % by weight of urethanes and 0 to 10% by weight of further additives, the sum of the constituents being 100% by weight.

A second aspect of the invention relates to a process for the preparation of a photopolymer formulation in which matrix polymers, writing monomers, photoinitiators and urethanes as plasticizers are mixed to give the photopolymer formulation.

A third aspect of the invention relates to a photopolymer formulation obtainable by the process.

A fourth aspect of the invention relates to a sheet, a film, a layer, a layer structure or a moulding comprising the photopolymer formulation.

Layers, layer structures and mouldings comprising the photopolymer formulations according to the invention typically have $\Delta n$ values, measured according to the method described in the section "Measurement of the holographic properties DE and $\Delta n$ of the holographic media by means of two-beam interference in reflexion arrangement", of $\Delta n > 0.012$, preferably $> 0.0135$, particularly preferably $> 0.015$, very particularly preferably $> 0.0165$.

A fifth aspect of the invention relates to the use of the photopolymer formulation for the production of optical elements, in particular for the production of holographic elements and images.

The invention also relates to a method for exposing holographic media and holographic photopolymer films comprising the photopolymer formulation according to the invention, in which the writing monomers present in the matrix are selectively polymerized by electromagnetic radiation.

After the holographic exposure, such holographic media are suitable for the production of holographic optical elements which, for example, have the function of an optical lens, a mirror, a deflection mirror, a filter, a diffuser screen, a diffraction element, a light conductor, a waveguide, a projection screen and/or a mask. In addition, holographic images or representations can also be produced therewith, such as, for example, for personal portraits, biometric representations in security documents, or generally of images or image structures for advertizing, security labels, trade mark protection, trade mark branding, labels, design elements, decorations, illustrations, multi journey tickets, images and the like and images which may represent digital data, inter alia also in combination with the products described above.

EXAMPLES

The invention is explained in more detail below with reference to examples.

Unless noted otherwise, all percentage data are based on percent by weight.

The measurement of the refractive $n_D^{20}$ index was effected at a wavelength of 589 nm and a temperature of 20° C. using a spectrometer from Steag ETA Optics (Model ETA-RT).

The stated NCO values (isocyanate contents) were determined according to DIN EN ISO 11909.

The commercial plasticizers used in the comparative media were obtained in the chemical trade (dimethyl adipate from Merck/Darmstadt, diethylglycol diacetate from ABCR, propylene carbonate from Fluka, triethyl citrate from Sigma-Aldrich).

CGI-909 (Tetrabutylammonium tris(3-chloro-4-methylphenyl)(hexyl)borate, [1147315-11-4]) is an experimental product produced by CIBA Inc., Basel, Switzerland.

Example 1

Ethyl hexylcarbamate

In a 250 ml round-bottomed flask, 0.02 g of Desmorapid Z (dibutyltin dilaurate, Bayer MaterialScience AG, Leverkusen, Germany), 36.7 g of n-hexyl isocyanate were initially introduced and heated to 60° C. Thereafter, 13.3 g of ethanol were added dropwise and the mixture was further kept at 60° C. until the isocyanate content had fallen below 0.1%. Thereafter, cooling was effected and the product was obtained as a clear liquid.

Example 2

Isopropyl hexylcarbamate

In a 250 ml round-bottomed flask, 0.02 g of Desmorapid Z, 34.0 g of n-hexyl isocyanate were initially introduced and heated to 60° C. Thereafter, 16.0 g of isopropanol were added dropwise and the mixture was further kept at 60° C. until the isocyanate content had fallen below 0.1%. Thereafter, cooling was effected and the product was obtained as a clear liquid.

Example 3

Ethyl butylcarbamate

In a 250 ml round-bottomed flask, 0.02 g of Desmorapid Z, 34.1 g of n-butyl isocyanate were initially introduced and heated to 60° C. Thereafter, 15.9 g of ethanol were added dropwise and the mixture was further kept at 60° C. until the isocyanate content had fallen below 0.1%. Thereafter, cooling was effected and the product was obtained as a clear liquid.

Example 4

Isopropyl butylcarbamate

In a 250 ml round-bottomed flask, 0.02 g of Desmorapid Z, 31.1 g of n-butyl isocyanate were initially introduced and heated to 60° C. Thereafter, 18.9 g of isopropanol were added dropwise and the mixture was further kept at 60° C. until the isocyanate content had fallen below 0.1%. Thereafter, cooling was effected and the product was obtained as a clear liquid.

TABLE 1

Characterization of Examples 1-4 and of the commercial plasticizers from Comparative Examples II-V

| Example | Name | $n_D^{20}$ |
| --- | --- | --- |
| 1 | Ethyl hexylcarbamate | 1.4376 |
| 2 | Isopropyl hexylcarbamate | 1.4336 |
| 3 | Ethyl butylcarbamate | 1.4313 |
| 4 | Isopropyl butylcarbamate | 1.4284 |
| II | Propylene carbonate | 1.4220 |
| III | Dimethyl adipate | 1.4350 |
| IV | Diethylene glycol diacetate | 1.4310 |
| V | Triethyl citrate | 1.4423 |

For testing the optical properties, media were produced and measured optically as described below:

Preparation of the Polyol Component

In a 1 l flask, 0.18 g of tin octoate, 374.8 g of ε-caprolactone and 374.8 g of a difunctional polytetrahydrofuran polyether polyol (equivalent weight 500 g/mol OH) were initially introduced and heated to 120° C. and kept at this temperature until the solids content (proportion of nonvolatile constituents) was 99.5% by weight or higher. Thereafter, cooling was effected and the product was obtained as a waxy solid.

Preparation of Urethane Acrylate 1

In a 500 ml round-bottomed flask, 0.1 g of 2,6-di-tert-butyl-4-methylphenol, 0.05 g of dibutyltin dilaurate (Desmorapid Z,) and 213.07 g of a 27% strength solution of tris(p-isocyanatophenyl) thiophosphate in ethyl acetate (Desmodur® RFE, product of Bayer MaterialScience AG, Leverkusen, Germany) were initially introduced and heated to 60° C. Thereafter, 42.37 g of 2-hydroxyethyl acrylate were added dropwise and the mixture was further kept at 60° C. until the isocyanate content had fallen below 0.1%. Thereafter, cooling was effected and the ethyl acetate was completely removed in vacuo. The product was obtained as a semicrystalline solid.

Medium 1

3.82 g of the polyol component prepared as described above were mixed with 2.50 g of urethane acrylate 1, 2.50 g of ethyl hexylcarbamate (Example 1), 0.10 g of CGI 909 (experimental product of Ciba Inc, Basel, Switzerland), 0.010 g of new methylene blue and 0.35 g of N-ethylpyrrolidone at 60° C. so that a clear solution was obtained. Thereafter, cooling to 30° C. was effected, 0.707 g of Desmodur® N 3900 (commercial product of Bayer MaterialScience AG, Leverkusen, Germany, hexane diisocyanate-based polyisocyanate, proportion of iminooxadiazinedione at least 30%, NCO content: 23.5%) was added and mixing was effected again. Finally, 0.006 g of Fomrez UL 28 (urethanization catalyst, commercial product of Momentive Performance Chemicals, Wilton, Conn., USA) was added and mixing was effected again briefly. The liquid material obtained was then poured onto a glass plate and covered there with a second glass plate which was kept at a distance of 20 μm by spacers. This test specimen was left to stand for 12 hours at room temperature and cured.

Media 2-4 were produced in an analogous manner from the examples shown in Table 1.

Comparative Medium I 8.89 g of the polyol component prepared as described above were mixed with 3.75 g of urethane acrylate 1, 0.15 g of CGI 909 (experimental product of Ciba Inc, Basel, Switzerland), 0.015 g of new methylene blue and 0.35 g of N-ethylpyrrolidone at 60° C. so that a clear solution was obtained. Thereafter, cooling to 30° C. was effected, 1.647 g of Desmodur® N 3900 (commercial product of Bayer MaterialScience AG, Leverkusen, Germany, hexane diisocyanate-based polyisocyanate, proportion of iminooxadiazinedione at least 30%, NCO content: 23.5%) was added and mixing was effected again. Finally, 0.009 g of Fomrez UL 28 (urethanization catalyst, commercial product of Momentive Performance Chemicals, Wilton, Conn., USA) was added and mixing was effected again briefly. The liquid material obtained was then poured onto a glass plate and covered there with a second glass plate which was kept at a distance of 20 μm by spacers. This test specimen was left to stand for 12 hours at room temperature and cured.

Comparative Medium II 3.82 g of the polyol component prepared as described above were mixed with 2.50 g of urethane acrylate 1, 2.50 g of propylene carbonate (Comparative Example II), 0.10 g of CGI 909 (experimental product of Ciba Inc, Basel, Switzerland), 0.010 g of new methylene blue and 0.35 g of N-ethylpyrrolidone at 60° C. so that a clear solution was obtained. Thereafter, cooling to 30° C. was effected, 0.702 g of Desmodur® N 3900 (commercial product of Bayer MaterialScience AG, Leverkusen, Germany, hexane diisocyanate-based polyisocyanate, proportion of iminooxadiazinedione at least 30%, NCO content: 23.5%) was added and mixing was effected again. Finally, 0.022 g of Fomrez UL 28 (urethanization catalyst, commercial product of Momentive Performance Chemicals, Wilton, Conn., USA) was added and mixing was effected again briefly. The liquid material obtained was then poured onto a glass plate and covered there with a second glass plate which was kept at a distance of 20 μm by spacers. This test specimen was left to stand for 12 hours at room temperature and cured.

Comparative media III-V were produced in an analogous manner from the comparative examples shown in Table 1.

Measurement of the Holographic Properties DE and Δn of the Holographic Media by Means of Two-Beam Interference in Reflection Arrangement The media produced as described in the section "Production of the holographic media based on photopolymer formulation with photoinitiator for determining the performance parameters DE and Δn" were then tested with regard to their holographic properties by means of a measuring arrangement according to FIG. 1, as follows:

The beam of an He—Ne laser (emission wavelength 633 nm) was converted with the aid of a spatial filter (SF) and together with the collimation lens (CL) into a parallel homogeneous beam. The final cross sections of the signal and reference beam are established by the iris diaphragms (I). The diameter of the iris diaphragm opening is 0.4 cm. The polarization-dependent beam splitters (PBS) split the laser beam into two coherent equally polarized beams. Via the λ/2 plates, the power of the reference beam was adjusted to 0.5 mW and the power of the signal beam to 0.65 mW. The powers were determined using the semiconductor detectors (D) with sample removed. The angle of incidence (α) of the reference beam is 21.8° and the angle of incidence (β) of the signal beam is 41.8°. At the location of the sample (medium), the interference field of the two overlapping beams produced a grating of light and dark strips which are perpendicular to the angle bisectors of the two beams incident on the sample (reflection hologram). The strip spacing Λ, also referred to as grating period, in the medium is ~225 nm (the refractive index of the medium assumed to be ~1.504).

FIG. 1 shows the holographic test setup with which the diffraction efficiency (DE) of the media was measured. FIG. 1 shows the geometry of an HMT at λ=633 nm (He—Ne laser): M=mirror, S=shutter, SF=spatial filter, CL=collimator lens, λ/2=λ/2 plate, PBS=polarization-sensitive beam splitter, D=detector, I=iris diaphragm, α=21.8°, β=41.8° are the angles of incidence of the coherent beams, measured outside the sample (outside the medium).

Holograms were recorded into the medium in the following manner:

Both shutters (S) are opened for the exposure time t.

Thereafter, with closed shutters (S), the medium is allowed a time of 5 minutes for the diffusion of the still unpolymerized writing monomers.

The holograms recorded were now read in the following manner. The shutter of the signal beam remained closed. The shutter of the reference beam was opened. The iris diaphragm of the reference beam was closed to a diameter of <1 mm. This ensured that the beam was always completely in the previously recorded hologram for all angles of rotation (Ω) of the medium. The turntable, under computer control, now covered the angle range from Ω=0° to Ω=20° with an angle step width of 0.05°. At each angle Ω approached, the powers of the beam transmitted in the zeroth order were measured by means of the corresponding detector D and the powers of the beam diffracted in the first order were measured by means of the detector D. The diffraction efficiency was obtained at each angle Ω approached as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (it describes the diffraction efficiency η as a function of the angle of rotation Ω of the recorded hologram) was measured and was stored in a computer. In addition, the intensity transmitted in the zeroth order was also plotted against the angle of rotation Ω and stored in a computer.

The maximum diffraction efficiency (DE=$\eta_{max}$) of the hologram, i.e. its peak value, was determined. It may have been necessary for this purpose to change the position of the detector of the diffracted beam in order to determine this maximum value.

The refractive index contrast Δn and the thickness d of the photopolymer layer were now determined by means of the coupled wave theory (cf.: H. Kogelnik, The Bell System Technical Journal, Volume 48, November 1969, Number 9 page 2909-page 2947) from the measured Bragg curve and the angle variation of the transmitted intensity. The method is described below:

For the Bragg curve η(Ω) of a reflection hologram, the following is true according to Kogelnik:

$$\eta = \frac{1}{1 + \frac{1 - (\chi/\Phi)^2}{\sinh^2(\sqrt{\Phi^2 - \chi^2})}}$$

with:

$$\Phi = \frac{\pi \cdot \Delta n \cdot d}{\lambda \cdot \sqrt{\cos(\alpha') \cdot \cos(\alpha' - 2\psi)}}$$

$$\chi = \Delta\theta \cdot \frac{2\pi \cdot \sin(\alpha' - \psi)}{\Lambda \cdot \cos(\alpha' - 2\psi)} \cdot \frac{d}{2}$$

$$\psi = \frac{\beta' - \alpha'}{2}$$

$$\Lambda = \frac{\lambda}{2 \cdot n \cdot \cos(\psi - \alpha')}$$

$$n \cdot \sin(\alpha') = \sin(\alpha), \, n \cdot \sin(\beta') = \sin(\beta)$$

$$\Delta\theta = -\Delta\Omega \cdot \sqrt{\frac{1 - \sin^2(\alpha)}{n^2 - \sin^2(\alpha)}}$$

$\Phi$ is the grating thickness, $\chi$ is the detuning parameter and $\psi$ is the tilt angle of the refractive index grating which was recorded, $\alpha'$ and $\beta'$ corresponding to the angles $\alpha$ and $\beta$ during recording of the hologram, but measured in the medium. $\Delta$ is the angle detuning measured in the medium, i.e. the deviation from the angle $\alpha'$. $\Delta\Omega$ is the angle detuning measured outside the medium, i.e. the deviation from the angle $\alpha$. n is the mean refractive index of the photopolymer and was set at 1.504. $\lambda$ is the wavelength of the laser light in vacuo.

The maximum diffraction efficiency (DE=$\eta_{max}$) is then obtained for $\chi=0$, i.e. $\Delta\Omega=0$ as:

$$DE = \tanh^2(\Phi) = \tanh^2\left(\frac{\pi \cdot \Delta n \cdot d}{\lambda \cdot \sqrt{\cos(\alpha') \cdot \cos(\alpha' - 2\psi)}}\right)$$

Figure 2:
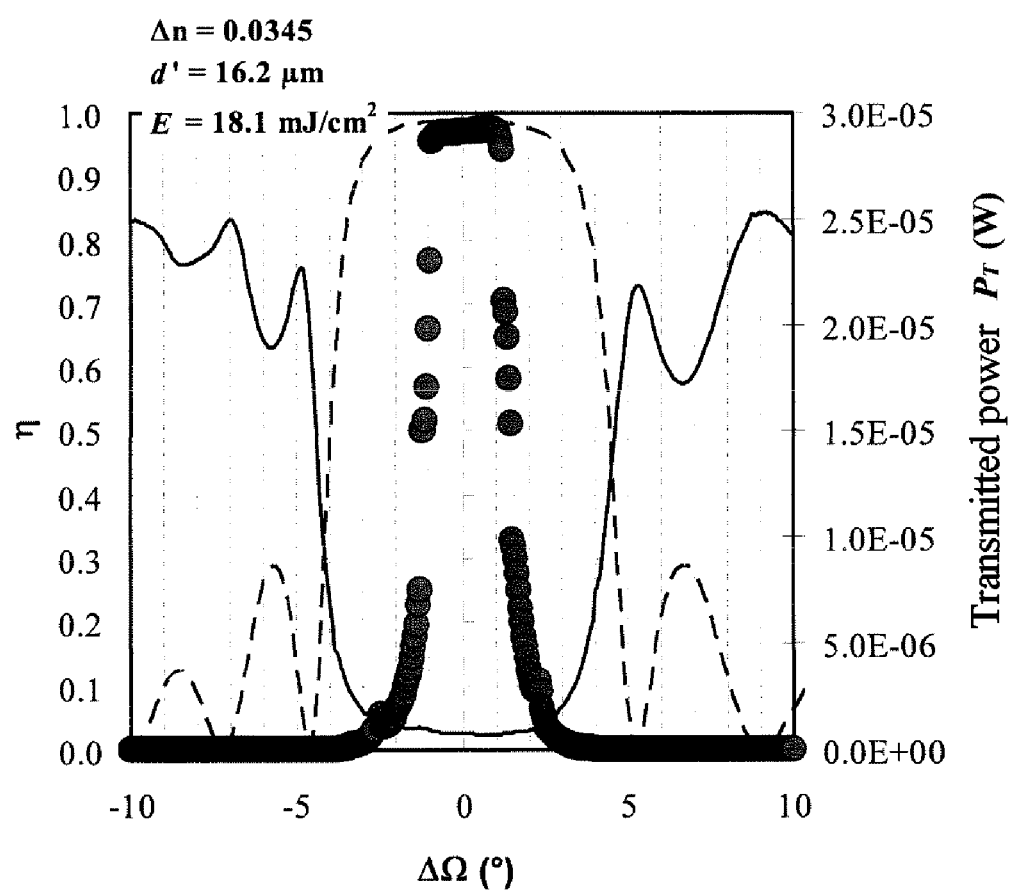
FIG. 2 illustrates a graph showing the measured data of the diffraction efficiency, the theoretical Bragg curve and the transmitted intensity, plotted against the centered angle of rotation $\Omega$-$\alpha$ shift.

The measured data of the diffraction efficiency, the theoretical Bragg curve and the transmitted intensity are, as shown in FIG. 2, plotted against the centred angle of rotation $\Omega-\alpha$ shift. Since, owing to geometrical shrinkage and the change in the average refractive index on photopolymerization, the angle at which DE is measured differs from $\alpha$, the x axis is centred about this shift. The shift is typically 0° to 2°.

Since DE is known, the shape of the theoretical Bragg curve according to Kogelnik is determined only by the thickness d of the photopolymer layer. $\Delta n$ is subsequently corrected via DE for a given thickness d so that measurement and theory of DE always agree. d is now adjusted until the angle positions of the first secondary minima of the theoretical Bragg curve agree with the angle positions of the first secondary maxima of the transmitted intensity and additionally the full width at half maximum (FWHM) for theoretical Bragg curve and the transmitted intensity agree.

Since the direction in which a reflection hologram concomitantly rotates on reconstruction by means of an $\Omega$ scan, but the detector for the diffracted light can detect only a finite angle range, the Bragg curve of broad holograms (small d) is not completely detected in an $\Omega$ scan, but only the central region, with suitable detector positioning. The shape of the transmitted intensity which is complementary to the Bragg curve is therefore additionally used for adjusting the layer thickness d.

FIG. 2 shows the plot of the Bragg curve η according to Kogelnik (dashed line), of the measured diffraction efficiency (solid circles) and of the transmitted power (black solid line) against the angle detuning $\Delta\Omega$. Since, owing to geometrical shrinkage and the change in the average refractive index on photopolymerization, the angle at which DE is measured differs from $\alpha$, the x axis is centred about this shift. The shift is typically 0° to 2°.

For a formulation, this procedure was possibly repeated several times for different exposure times t on different media in order to determine the average energy dose of the incident laser beam at which DE reaches the saturation value during recording of the hologram. The mean energy dose E is obtained from the powers of the two part-beams coordinated with the angles $\alpha$ and $\beta$ ($P_\alpha$=0.50 mW and $P_\beta$=0.67 mW), the exposure time t and the diameter of the iris diaphragm (0.4 cm), as follows:

$$E(mJ/cm^2) = \frac{2 \cdot [P_\alpha + P_\beta] \cdot t(s)}{\pi \cdot 0.4^2 \text{ cm}^2}$$

The powers of the part-beams were adapted so that the same power density is achieved in the medium at the angles $\alpha$ and $\beta$ used.

The following measured values for DE [%] and $\Delta n$ were obtained thereby at the dose E [mJ/cm$^2$]:

TABLE 2

Holographic evaluation of selected Examples

| Medium | Examples [% by weight] | $\Delta n$ | DE [%] | Dose E [mJ/cm$^2$] |
|---|---|---|---|---|
| 1 | Ethyl hexylcarbamate, 25 | 0.0172 | 94 | 9 |
| 2 | Isopropyl hexylcarbamate, 25 | 0.0174 | 97 | 9 |
| 3 | Ethyl butylcarbamate, 25 | 0.0167 | 87 | 9 |
| 4 | Isopropyl butylcarbamate, 25 | 0.0176 | 93 | 9 |

| | Comparative Examples [% by weight] | $\Delta n$ | DE [%] | Dose E [mJ/cm$^2$] |
|---|---|---|---|---|
| I | No additive | 0.0115 | 89 | 9 |
| II | Propylene carbonate, 25 | 0.0136 | 87 | 36 |
| III | Dimethyl adipate, 25 | 0.0146 | 88 | 36 |
| IV | Diethylene glycol diacetate, 25 | 0.0146 | 93 | 18 |
| V | Triethyl citrate, 25 | 0.0115 | 78 | 72 |

The values found for the holographic properties dynamic range (DE) and $\Delta n$ of the holographic media show that the commercial additives used in the comparative medium are less suitable for use in holographic media, whereas the urethanes according to the invention are very suitable in media 1 to 4 for the production of holographic media, owing to the high values of DE and the higher value for $\Delta n$. In addition, the plot in FIG. 2 shows that the urethane acrylates found here lead to better holographic performance in spite of their higher refractive index.

The invention claimed is:

1. A photopolymer formulation comprising matrix polymers, writing monomers and photoinitiators, wherein the photopolymer formulation further comprises urethanes as plasticizers, wherein the urethanes have a molecular weight of less than or equal to 250 g/mol, wherein the matrix polymers comprise polyurethanes and wherein the urethanes consists of aliphatic urethanes having the formula (I),

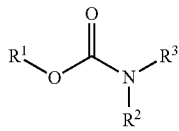

(I)

Wherein $R^1$ and $R^2$ are independent of one another, represent a linear or branched $(C_1\text{-}C_{20})$-alkyl radical and $R^3$ is hydrogen.

2. The photopolymer formulation according to claim 1, wherein the polyurethanes are obtained by reacting an isocyanate component and an isocyanate-reactive component.

3. The photopolymer formulation according to claim 1, wherein the writing monomers comprise acrylates.

4. The photopolymer formulation according to claim 1, wherein the writing monomers comprise urethane acrylates.

5. The photopolymer formulation according to claim 1, wherein the urethanes have a molecular weight of less than or equal to 200 g/mol.

6. The photopolymer formulation according to claim 1, wherein the urethanes have a molecular weight of less than or equal to 190 g/mol.

7. The photopolymer formulation according to claim 1, wherein $R^1$ represents a linear or branched (C1-C8)-alkyl radical and/or $R^2$ represents a linear or branched (C1-C8)-alkyl radical.

8. The photopolymer formulation according to claim 1, wherein $R^1$ represents a linear or branched (C1-C4)-alkyl radical and/or $R^2$ represents a linear or branched (C1-C6)-alkyl radical.

9. The photopolymer formulation according to claim 1, wherein the urethanes have substantially no free NCO groups.

10. The photopolymer formulation according to claim 1, wherein the photopolymer formulation consists essentially of 15 to 79% by weight of matrix polymers, 5 to 50% by weight of writing monomers, 1 to 10% by weight of photoinitiators and 5 to 50% by weight of urethanes and 0 to 10% by weight of further additives, wherein the sum of the constituents being 100% by weight.

11. The photopolymer formulation according to claim 1, wherein the photopolymer formulation consists essentially of 30 to 60% by weight of matrix polymers, 10 to 40% by weight of writing monomers, 1 to 3% by weight of photoinitiators and 10 to 40% by weight of urethanes and 0 to 10% by weight of further additives, wherein the sum of the constituents being 100% by weight.

12. A process for the preparation of the photopolymer formulation according to claim 1, wherein the process comprises mixing the matrix polymers, writing monomers, photoinitiators and urethanes as plasticizers to foam a photopolymer formulation.

13. A sheet, film, layer, layer structure or moulding comprising the photopolymer formulation according to claim 1.

14. Holographic elements and/or images formed from the photopolymer formulation according to claim 1.

* * * * *